US009800209B2

(12) United States Patent
Li

(10) Patent No.: US 9,800,209 B2
(45) Date of Patent: Oct. 24, 2017

(54) DOHERTY POWER AMPLIFIER

(71) Applicant: ZTE Corporation, Shenzhen, Guangdong (CN)

(72) Inventor: Chao Li, Shenzhen (CN)

(73) Assignee: XI'AN ZHONGXING NEW SOFTWARE CO. LTD., Xi'an (CN)

( * ) Notice: Subject to any disclaimer, the term of this patent is extended or adjusted under 35 U.S.C. 154(b) by 0 days.

(21) Appl. No.: 14/906,356

(22) PCT Filed: Dec. 30, 2013

(86) PCT No.: PCT/CN2013/090953
§ 371 (c)(1),
(2) Date: Feb. 24, 2016

(87) PCT Pub. No.: WO2014/161362
PCT Pub. Date: Oct. 9, 2014

(65) Prior Publication Data
US 2016/0164473 A1    Jun. 9, 2016

(30) Foreign Application Priority Data

Jul. 25, 2013    (CN) .................... 2013 2 0449521 U

(51) Int. Cl.
| H03F 3/68 | (2006.01) |
| H03F 1/07 | (2006.01) |
| H03F 1/02 | (2006.01) |
| H03F 3/60 | (2006.01) |
| H03F 3/189 | (2006.01) |
| H03F 3/22 | (2006.01) |

(52) U.S. Cl.
CPC ............. *H03F 1/07* (2013.01); *H03F 1/0288* (2013.01); *H03F 3/189* (2013.01); *H03F 3/22* (2013.01); *H03F 3/602* (2013.01); *H03F 2200/451* (2013.01)

(58) Field of Classification Search
CPC ............................. H03F 3/68; H03F 2200/411
USPC .................................. 330/65, 66, 124 R, 295
See application file for complete search history.

(56) References Cited

U.S. PATENT DOCUMENTS

| 7,053,718 B2 | 5/2006 | Dupuis |
| 7,474,155 B2 | 1/2009 | Amano |
| 2005/0068103 A1 | 3/2005 | Dupuis |
| 2007/0222521 A1 | 9/2007 | Amano |
| 2009/0295473 A1* | 12/2009 | Dupuy .................. H03F 1/0222 330/124 R |

(Continued)

FOREIGN PATENT DOCUMENTS

| CN | 1898860 A | 1/2007 |
| CN | 202535311 U | 11/2012 |
| KR | 100760519 B1 | 9/2007 |

OTHER PUBLICATIONS

International Search Report in international application No. PCT/CN2013/090953, mailed on May 8, 2014.

(Continued)

*Primary Examiner* — Steven J Mottola
(74) *Attorney, Agent, or Firm* — Oppedahl Patent Law Firm LLC

(57) ABSTRACT

Disclosed is a Doherty power amplifier. At least one power amplification tube and other power amplification tubes in the Doherty power amplifier are located in different planes.

11 Claims, 8 Drawing Sheets

(56) References Cited

U.S. PATENT DOCUMENTS

2014/0062589 A1* 3/2014 Schenk .................... H01G 5/16
                                                    330/124 R

OTHER PUBLICATIONS

English Translation of the Written Opinion of the International Search Authority in international application No. PCT/CN2013/090953, mailed on May 8, 2014.

* cited by examiner

DOHERTY POWER AMPLIFIER

TECHNICAL FIELD

The present disclosure relates to the field of communications, and in particular to a Doherty power amplifier.

BACKGROUND

Radio frequency power amplifiers (power amplifiers for short) are widely applied to various wireless communication transmitting apparatuses. The ratio of the cost of a linear power amplifier to the cost of a base station is about 1/3, and how to effectively solve the problem of linearization of the power amplifiers with low cost will be more important. The research on a Doherty power amplifier with high efficiency and high linearity is a hot subject.

The current design of combining digital pre-distortion with Doherty power amplification has been widely applied to the power amplifiers, which greatly improves the efficiencies of the power amplifiers. The power amplifier's efficiency can reach 50%.

With the gradual maturity of a Doherty technology, design solutions for Doherty change quickly, including multi-path Doherty, asymmetric Doherty, Doherty-to-Doherty and the like. However, these technologies are updated only based on the collocation of power amplification tubes, and a traditional structural layout is still adopted. As shown in FIG. 1 and FIG. 2, according to the traditional layout of the power amplification tubes, the power amplification tubes in a Carrier path and a Peaking path are located next to each other in the same plane. Specifically, a traditional Doherty power amplifier includes a Printed Circuit Board (PCB) 1 with the length L and the width W. The input signal enters the Doherty power amplifier from a power amplifier input port 5, passes through a power divider 6, enters a Carrier power amplification tube and a Peaking power amplification tube, enters a combiner 8 for power combination, and finally reaches a power amplifier output port 7. The PCB1 can be tightly attached to a cooled metal substrate via screws or a full-page welding process, and thus the PCB1 and the metal substrate can be generally called a PCB. The height from a bottom surface of the PCB to a bottom surface of a cover plate is H. The traditional Doherty power amplifier includes 3 layers. FIG. 2 shows a side of the traditional Doherty power amplifier, including the PCB, a cavity 11 for containing a power amplification tube circuit, and the cover plate of the Doherty power amplifier.

By means of the traditional layout, the area of the plane of the PCB used by a Doherty circuit is larger, and the heat of the power amplification tubes in the Carrier path may influence the performance of the power amplification tubes in the Peaking path. The hotter the power amplification tubes are, the lower the efficiency of the power amplifier is.

SUMMARY

In view of this, an embodiment of the present disclosure is intended to provide a Doherty power amplifier, which is used to decrease the area of a PCB plane of the Doherty power amplifier.

The technical solutions of the embodiments of the present disclosure are implemented as follows.

A Doherty power amplifier is provided, wherein at least one power amplification tube is located in a different plane from other power amplification tubes in the Doherty power amplifier.

The width of the Doherty power amplifier may be smaller than a width formed by locating all the power amplification tubes in the same plane.

The at least one power amplification tube is arranged to be longitudinally overlapped with at least one of the other power amplification tubes in the Doherty power amplifier.

The Doherty power amplifier may include at least one Carrier power amplification tube, and may further include at least one Peaking power amplification tube.

When there are two or more Carrier power amplification tubes, all the Carrier power amplification tubes may be located in different planes; or, at least two Carrier power amplification tubes in all the Carrier power amplification tubes may be located in the same plane; and/or, when there are two or more Peaking power amplification tubes, all the Peaking power amplification tubes may be located in different planes; or, at least two Peaking power amplification tubes in all the Peaking power amplification tubes may be located in the same plane.

The power amplification tubes in the Doherty power amplifier may be arranged on a Printed Circuit Board (PCB).

The PCB may be a single-side PCB; or, the PCB may be a double-side PCB.

The Carrier power amplification tubes and the Peaking power amplification tubes of the Doherty power amplifier may be connected via a combining or branching structure which may include a radio frequency cable or a three-dimensional micro-strip line.

The Doherty power amplifier may further include a cover plate for the power amplification tubes in the same plane, wherein the cover plate and the PCB, where the power amplification tubes are located, may form a shielding cavity for surrounding the power amplification tubes.

The Doherty power amplifier may include at least one power amplification tube channel, wherein each power amplification tube channel includes at least one Carrier power amplification tube and further includes at least one Peaking power amplification tube.

Compared with the traditional art, the embodiments of the present disclosure have the following remarkable advantages: (1) the area of the PCB plane of the Doherty power amplifier can be reduced by 50%; (2) the Carrier power amplification tubes and the Peaking power amplification tubes are cooled separately, thereby reducing heat influences on the Peaking power amplification tubes caused by the Carrier power amplification tubes, and more improving the performance of the Peaking power amplification tubes; (3) the Carrier power amplification tubes and the Peaking power amplification tubes are designed in different cavities respectively, thereby reducing mutual influences; and (4) cheaper materials can be adopted as cooling materials of the Peaking power amplification tubes, thereby reducing costs.

Figure 1:
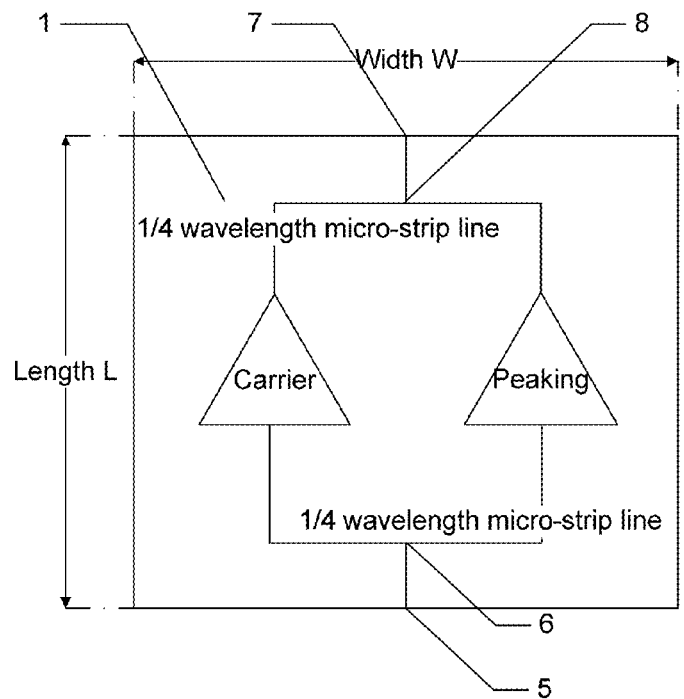
FIG. 1 is a top view of a Carrier path and a Peaking path in a traditional Doherty circuit.
Figure 2:
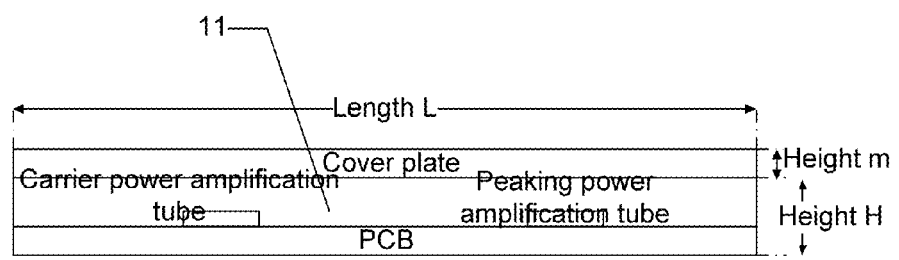
FIG. 2 is a side view of a Carrier path and a Peaking path in a traditional Doherty circuit.

The description of reference numbers in the drawings is as follows:

1, PCB; 5, power amplifier input port; 6, power divider; 7, power amplifier output port; 8, combiner; 11, cavity; 14, combiner; 16, power divider; 18, ; 20, power amplifier input port; 21, power amplifier output port; 22, cavity for Carrier power amplification tube; 23, PCB for Carrier power amplification tube; 25, cavity for Peaking power amplification tube; 26, cover plate; 28, cavity for Peaking power amplification tube; 29, cavity for Carrier power amplification tube; 32, combiner-end PCB connecting line; 35, power divider-end PCB connecting line; 36, combiner-end PCB connecting line; 38, power divider-end PCB connecting line; 40, PCB; 41, power amplifier output port; 44, power amplifier input port; 46, PCB; 47, combiner; 48, power amplifier output port; 51, ; 52, ; 54, power divider; 55, power amplifier input port; 59, cavity for Peaking power amplification tube 1; 60, cavity for Carrier power amplification tube; 61, cavity for Peaking power amplification tube 2; 62, power divider-end PCB connecting line; 63, combiner-end PCB connecting line; 64, power divider-end PCB connecting line; 65, cavity for Carrier power amplification tube; 67, PCB; 68, power amplifier output port; 69, combiner; 70, power divider; 71, power amplifier input port; 72, combiner-end PCB connecting line; 74, power amplifier output port; 77, power amplifier input port; 78, power divider; 79, power amplifier input port; 80, combiner; 81, power divider; 82, combiner; 85, power amplifier output port; 86, power divider-end PCB connecting line; 87, cavity for Carrier power amplification tube; 88, cavity for Peaking power amplification tube; 89, cavity for Carrier power amplification tube; 90, cavity for Peaking power amplification tube; 91, combiner-end PCB connecting line; 95, power divider-end PCB connecting line; and 98, combiner-end PCB connecting line.

DETAILED DESCRIPTION

Figure 3:
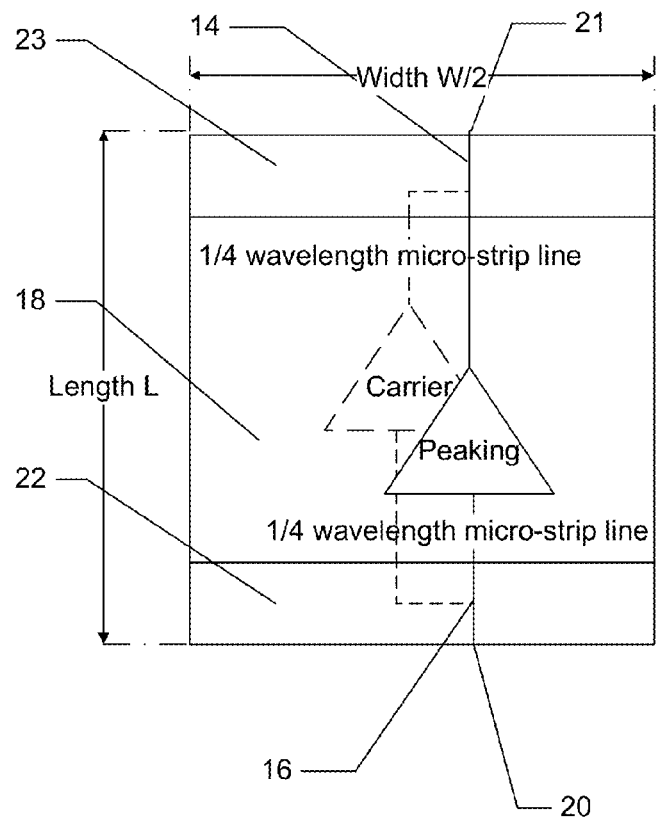
FIG. 3 is a top view of a Doherty power amplifier according to an embodiment of the present disclosure.
Figure 4:
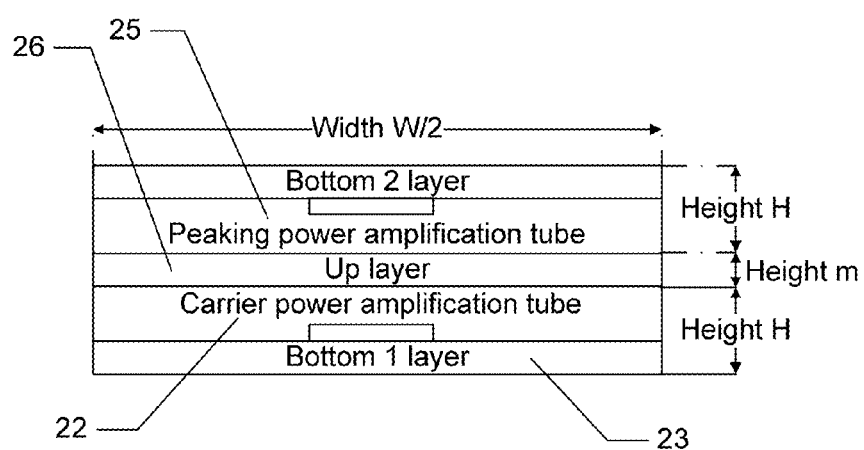
FIG. 4 is a side view 1 of a layout 1 of a Doherty power amplifier according to an embodiment of the present disclosure.

In practical application, the Doherty power amplifier can be designed by combining the working characteristics of the Carrier path and the Peaking path. As shown in FIG. 3 and FIG. 4, the area of the plane of a PCB 23 used by the Doherty power amplifier can be reduced by 50% to the greatest extent.

Figure 5:
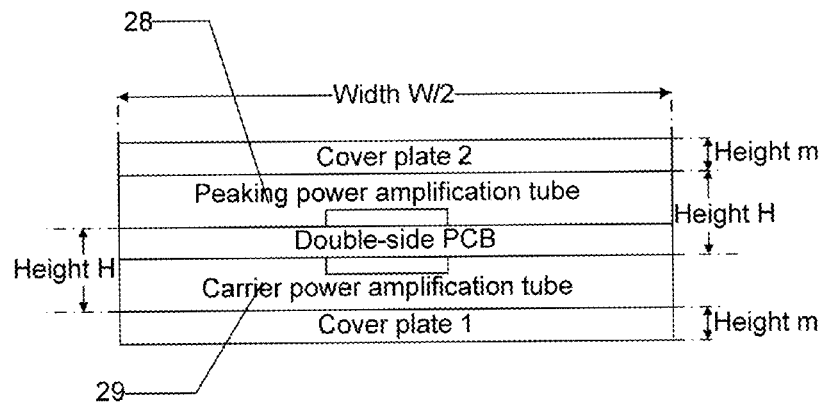
FIG. 5 is a side view 1 of a layout 2 of a Doherty power amplifier according to an embodiment of the present disclosure.
Figure 6:
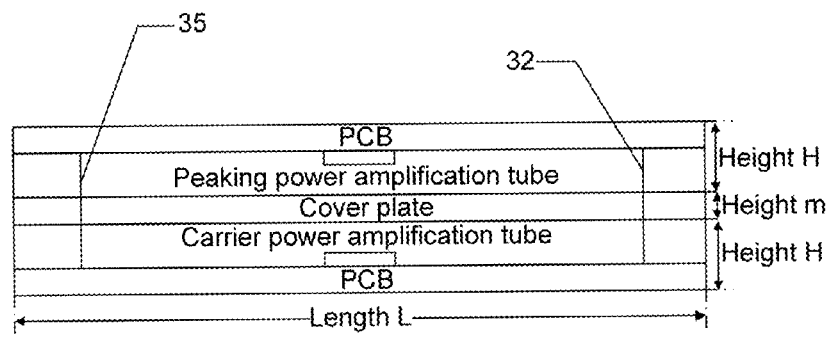
FIG. 6 is a side view 2 of a layout 1 of a Doherty power amplifier according to an embodiment of the present disclosure.
Figure 7:
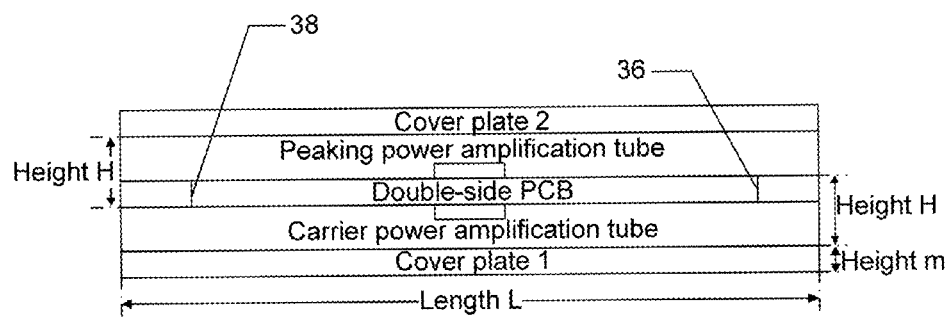
FIG. 7 is a side view 2 of a layout 2 of a Doherty power amplifier according to an embodiment of the present disclosure.

Compared with the layout of the traditional Doherty power amplifier, the layout of a small-sized three-dimensional Doherty power amplifier has the advantages that the length is L, and the width is half of that of the traditional Doherty power amplifier, namely W/2. The input signal enters the Doherty power amplifier from a power amplifier input port 20, passes through a power divider 16, enters the Carrier power amplification tubes and the Peaking power amplification tubes which are arranged on the two sides of a double-side PCB respectively, passes through a combiner 14 for power combination, and finally reaches a power amplifier output port 21. A layout structure consisting of an upper layer and a lower layer has two configurations. As shown in FIG. 4 and FIG. 6, the side in the first configuration includes a 5-layer structure, including a PCB for a Carrier power amplification tube, a cavity 22 for enclosing the Carrier power amplification tube, a cover plate 26 for shielding the power amplifier, a cavity 25 for enclosing a Peaking power amplification tube and a PCB for the Peaking power amplification tube. A power divider-end PCB connecting line 35 configured by the Peaking power amplification tube and the Carrier power amplification tube to connect to a power divider 16 and a combiner-end PCB connecting line 32 configured by the Peaking power amplification tube and the Carrier power amplification tube to connect to a combiner 14 pass through openings of the cover plate respectively to achieve connection between the corresponding power amplification tubes and the corresponding power dividers and combiners via a radio frequency cable or in a separate micro-strip manner, for instance. As shown in FIG. 5 and FIG. 7, the side face in the second configuration includes a 5-layer structure, including a double-side PCB, a cavity 29 for enclosing the Carrier power amplification tube, a cover plate 1, a cavity 28 for enclosing the Peaking power amplification tube and a cover plate 2. A power divider-end PCB connecting line 38 configured by the Peaking power amplification tube and the Carrier power amplification tube to connect to the power divider 16 and a combiner-end PCB connecting line 36 configured by the Peaking power amplification tube and the Carrier power amplification tube to connect to the combiner 14 pass through openings of the double-side PCB respectively to achieve connection between the corresponding power amplification tubes and the corresponding power dividers and combiners via a radio frequency cable or in a separate micro-strip manner, for instance.

Figure 8:
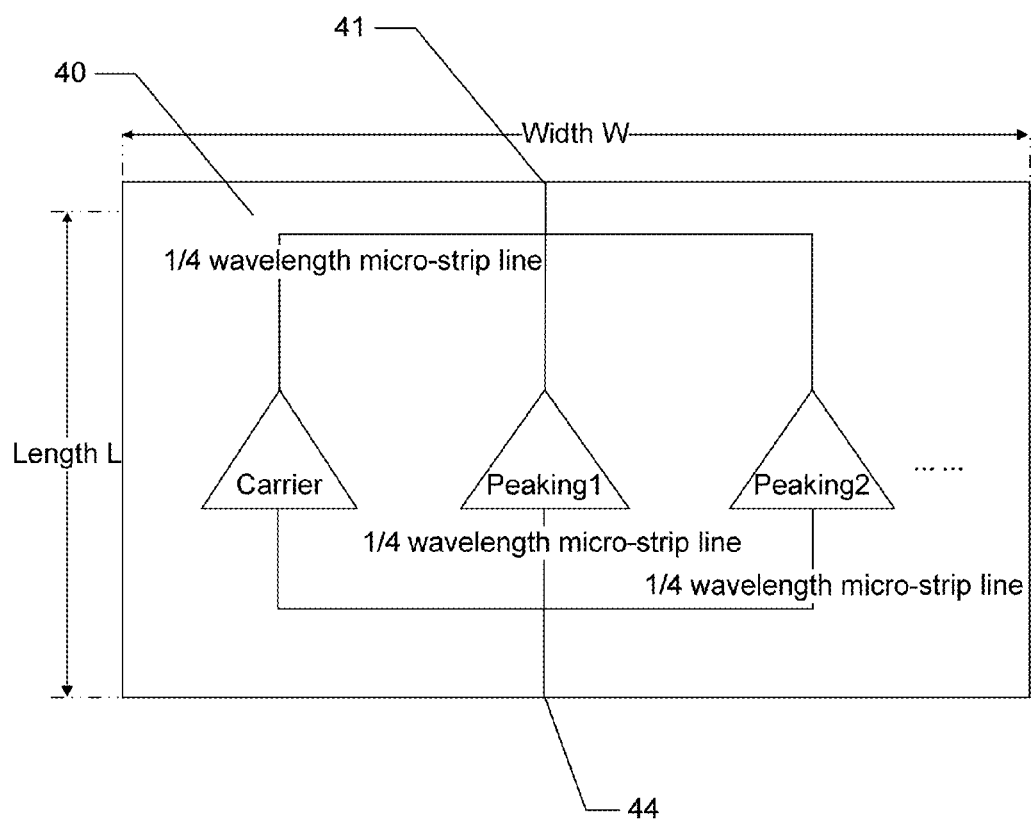
FIG. 8 is a top view of a Carrier path and Peaking paths of a traditional 3-path Doherty power amplifier.

Effects are more remarkable by means of the three-dimensional small-sized design of a multi-path Doherty power amplifier according to an embodiment of the present disclosure. A 3-path Doherty power amplifier including a Carrier path and two Peaking paths is taken as an example. As shown in FIG. 8, according to the traditional design solutions, the 3-path Doherty power amplifier includes a Carrier power amplification tube, the two Peaking paths are two Peaking power amplification tubes namely a Peaking 1 power amplification tube and a Peaking 2 power amplification tube, the 3-path Doherty power amplifier further includes a ¼ wavelength micro-strip line, an input/output 1-to-3 power divider (the power may be not equally divided, and lots of currently designed Doherty power amplifiers are asymmetric) and a combiner. The devices are all placed on a PCB40. The designed width is W according to a traditional layout method for a Doherty power amplifier.

Figure 9:
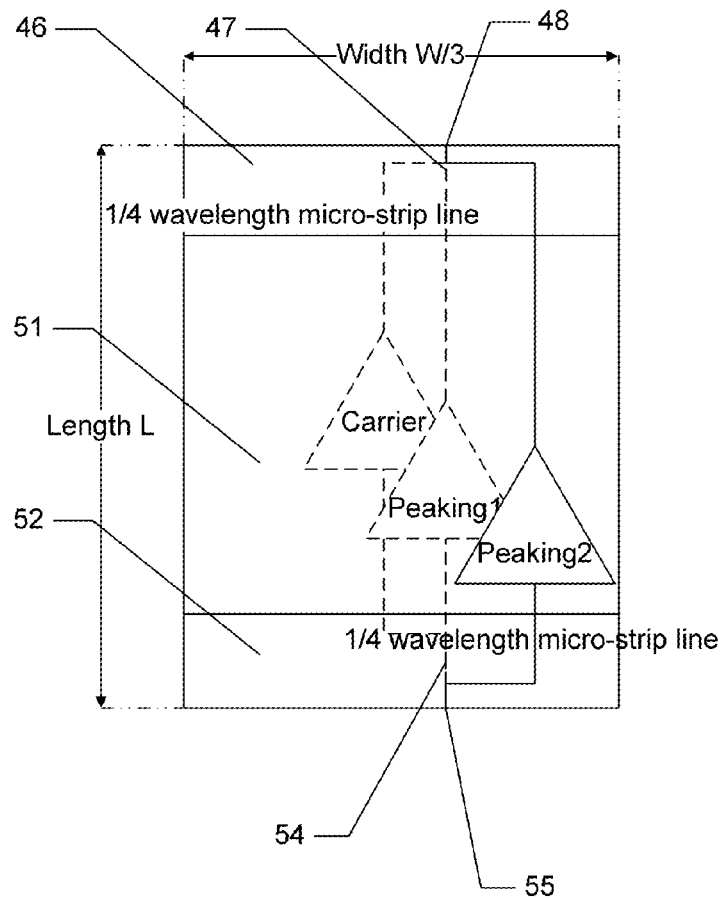
FIG. 9 is a top view of a 3-path Doherty power amplifier according to an embodiment of the present disclosure.
Figure 10:
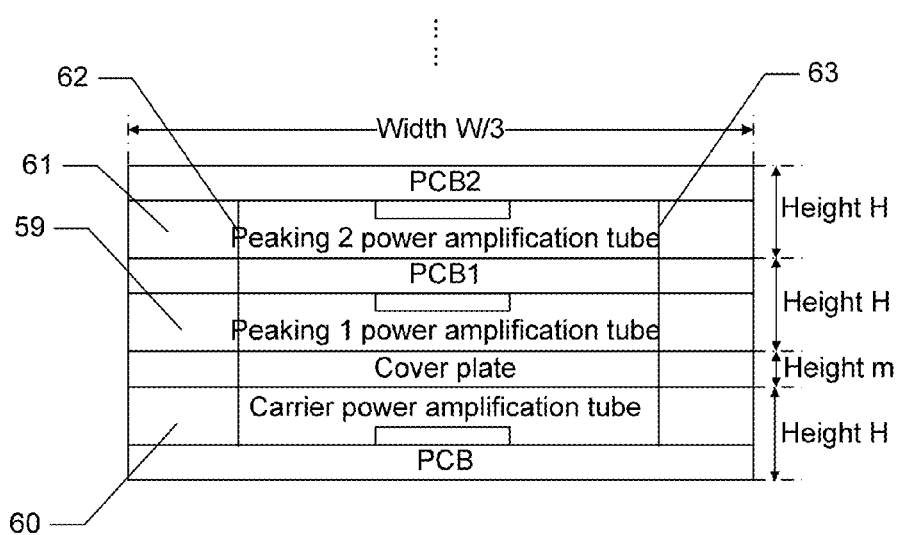
FIG. 10 is a side view of a layout 1 of a 3-path Doherty power amplifier according to an embodiment of the present disclosure.

As shown in FIG. 9, the layout width of the Doherty power amplifier can be reduced to W/3 to the greatest extent by using the three-dimensional small-sized layout. There are multiple specific layout configurations as follows. In the first configuration, the input signal enters the Doherty power amplifier from a power amplifier input port 55, enters the Carrier power amplification tube, the Peaking 1 power amplification tube and the Peaking 2 power amplification tube (which are arranged on three PCBs respectively) via a power divider 54, passes through a combiner 47 for power combination, and finally reaches a power amplifier output port 48. As shown in FIG. 10, the side in FIG. 9 includes a 7-layer structure, including a PCB where the Carrier power amplification tube is arranged, a cavity 60 for enclosing the Carrier power amplification tube, a cover plate, a cavity 59 for enclosing the Peaking 1 power amplification tube, a PCB1 where the Peaking 1 power amplification tube is arranged, a cavity 61 for enclosing the Peaking 2 power amplification tube, and a PCB2 where the Peaking 2 power amplification tube is arranged. The design of the Peaking 2 power amplification tube is similar to that of the Peaking 1 power amplification tube. A power divider-end PCB connecting line 62 configured by the Carrier power amplification tube, the Peaking 1 power amplification tube and the Peaking 2 power amplification tube to connect to the power divider 54 and a combiner-end PCB connecting line 63 configured by the Carrier power amplification tube, the Peaking 1 power amplification tube and the Peaking 2 power amplification tube to connect to the combiner 47 pass through openings of the cover plate and the PCB1 respectively to achieve connection between the corresponding power amplification tubes and the corresponding power dividers and combiners via a radio frequency cable or in a separate micro-strip manner, for instance.

Figure 11:
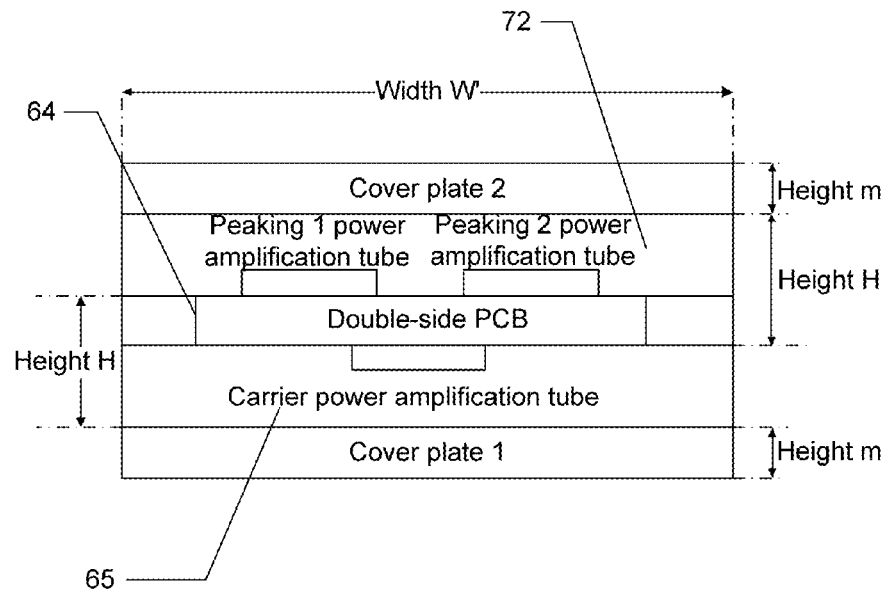
FIG. 11 is a side view of a layout 2 of a 3-path Doherty power amplifier according to an embodiment of the present disclosure.

In the second configuration, the layout width is reduced to W', according to a side view of this configuration as shown in FIG. 11, the double-side PCB is adopted, the Peaking 1 power amplification tube and the Peaking 2 power amplification tube are arranged on one side, and the Carrier power amplification tube is arranged on the other side. FIG. 11 shows a 5-layer structure, including a cover plate 1 for the Carrier power amplification tube, a cavity 65 for enclosing the Carrier power amplification tube, a double-side PCB where the Carrier power amplification tube is arranged, a cavity for enclosing the Peaking 1 power amplification tube and the Peaking 2 power amplification tube, and a cover plate 2 for the Peaking 1 power amplification tube and the Peaking 2 power amplification tube. A power divider-end PCB connecting line 64 configured by the Peaking 1 power amplification tube and a Carrier 1 power amplification tube to connect to the power divider 54 and a combiner-end PCB connecting line 72 configured by the Peaking 2 power amplification tube and the Carrier power amplification tube to connect to the combiner 47 pass through openings of the double-side PCB respectively to achieve connection between the corresponding power amplification tubes and the corresponding power dividers and combiners via a radio frequency cable or in a separate micro-strip manner, for instance.

Figure 12:
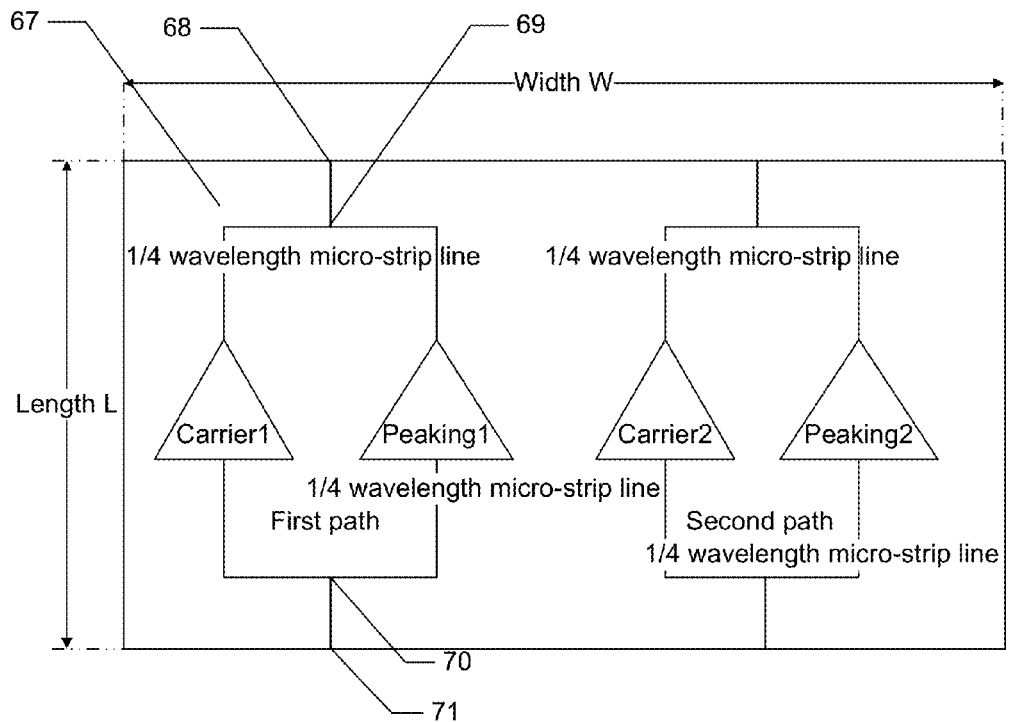
FIG. 12 is a top view of a Carrier path and a Peaking path of a traditional 2-path Doherty power amplifier.

When multiple paths are adopted, the 2-path solution is taken as an example. According to the layout of a traditional 2-path Doherty power amplifier as shown in FIG. 12, two paths are distributed on the same PCB67. When the first path works, an input signal enters the Doherty power amplifier from a power amplifier input port 71, enters the Carrier 1 power amplification tube and the Peaking 1 power amplification tube via a power divider 70, passes through a combiner 69 for power combination, and finally reaches a power amplifier output port 68. The working way of the second path is similar to that of the first path.

Figure 13:
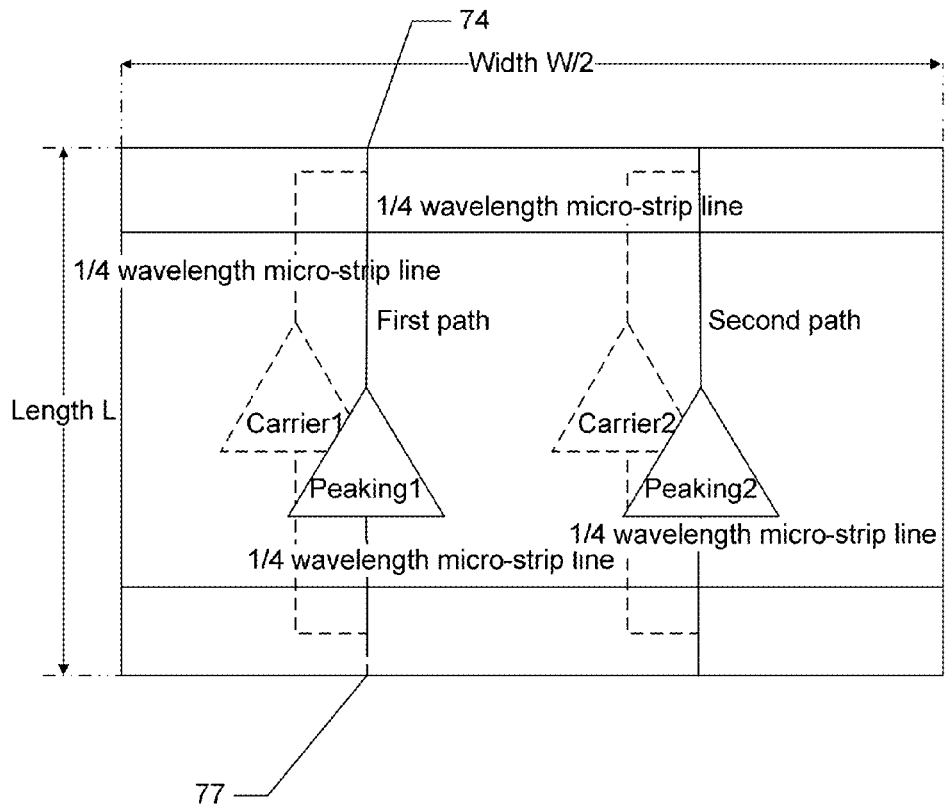
FIG. 13 is a top view of a 2-path Doherty power amplifier according to an embodiment of the present disclosure.

With respect to the two paths as shown in FIG. 12, a three-dimensional small-sized Doherty layout structure according to an embodiment of the present disclosure is shown in FIG. 13. When the first path works, the input signal enters the Doherty power amplifier from a power amplifier input port 77, enters the Carrier 1 power amplification tube and the Peaking 1 power amplification tube (which are arranged on two PCBs respectively) via a power divider 78, passes through a combiner 80 for power combination, and finally reaches a power amplifier output port 74. The working way of the second path is similar to that of the first path. The side design of each path can be shown in FIG. 4 and FIG. 5.

Figure 14:
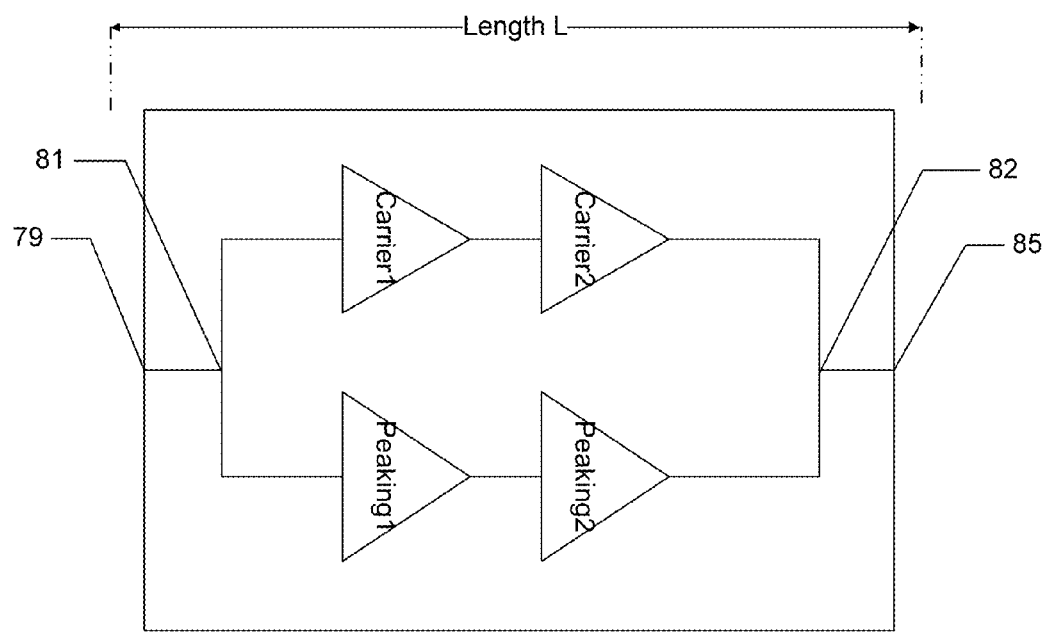
FIG. 14 is a top view of a Carrier path and a Peaking path of a traditional 2-stage Doherty power amplifier.

Multiple Peaking power amplification tubes and Carrier power amplification tubes are adopted for a multi-stage Doherty power amplifier generally. A 2-stage Doherty power amplifier is taken as an example, and a traditional 2-stage Doherty power amplifier is shown in FIG. 14. An input signal enters the Doherty power amplifier from a power amplifier input port 79, enters the Carrier 1 power amplification tube, a Carrier 2 power amplification tube, the Peaking 1 power amplification tube and the Peaking 2 power amplification tube via a power divider 81, passes through a combiner 82 for power combination, and finally reaches a power amplifier output port 85. The three-dimensional small-sized layout according to an embodiment of the present disclosure is shown in FIG. 15.

Figure 15:
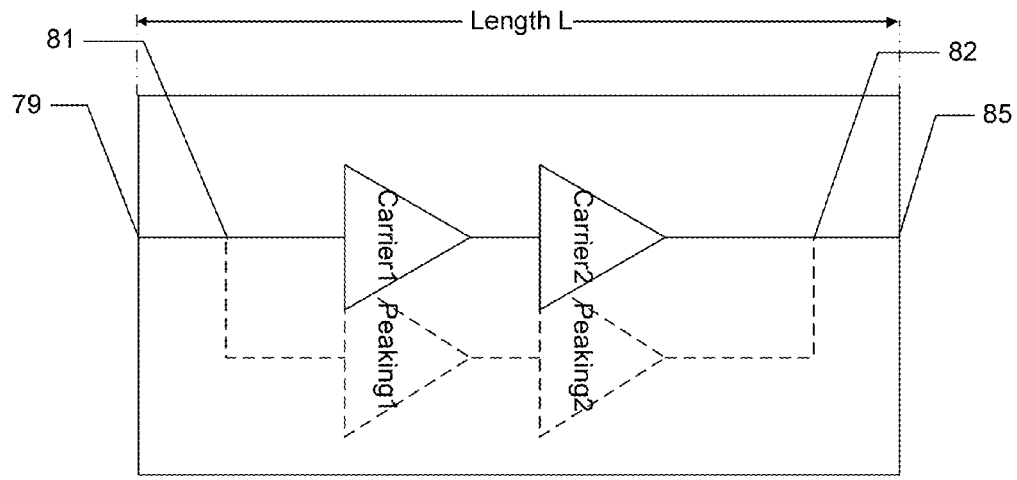
FIG. 15 is a top view of a Carrier path and a Peaking path of a 2-stage Doherty power amplifier according to an embodiment of the present disclosure.
Figure 16:
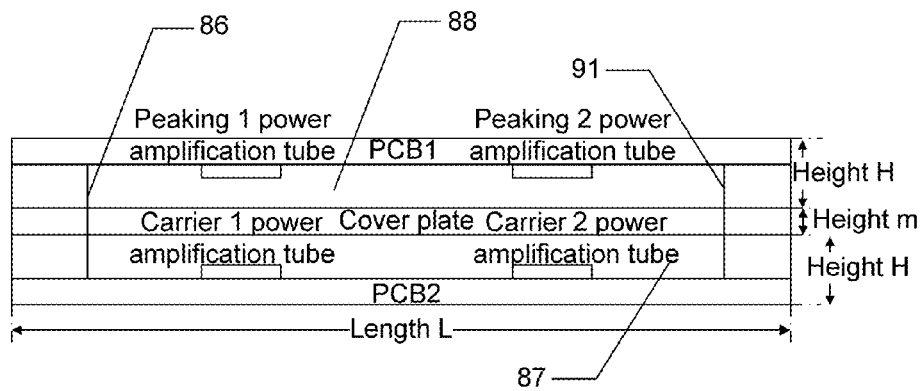
FIG. 16 is a side view 1 of a 2-stage Doherty power amplifier according to an embodiment of the present disclosure.
Figure 17:
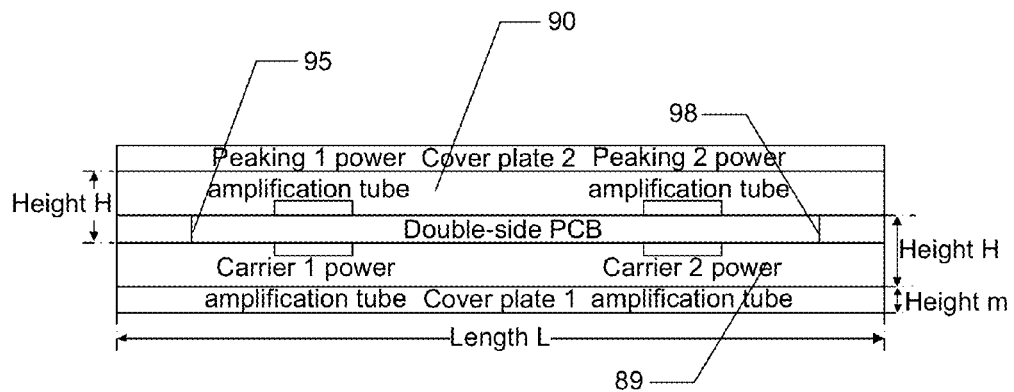
FIG. 17 is a side view 2 of a 2-stage Doherty power amplifier according to an embodiment of the present disclosure.

The side in FIG. 15 can be represented in two ways, and includes a 5-layer structure. As shown in FIG. 16, in the first way, the side includes a PCB2 where the Carrier 1 power amplification tube and the Carrier 2 power amplification tube are arranged, a cavity 87 for enclosing the Carrier 1 power amplification tube and the Carrier 2 power amplification tube, a cover plate, a cavity 88 for enclosing the Peaking 1 power amplification tube and the Peaking 2 power amplification tube, and a PCB1 where the Peaking 1 power amplification tube and the Peaking 2 power amplification tube are arranged. A power divider-end PCB connecting line 86 configured by the Peaking 1 power amplification tube and the Carrier 1 power amplification tube to connect to the power divider 81 and a combiner-end PCB connecting line 91 configured by the Peaking 2 power amplification tube and the Carrier 2 power amplification tube to connect to the combiner 82 pass through openings of the cover plate respectively to achieve connection between the corresponding power amplification tubes and the corresponding power dividers and combiners via a radio frequency cable or in a separate micro-strip manner, for instance. As shown in FIG. 17, in the second way, the double-side PCB is adopted, the Peaking 1 power amplification tube and the Peaking 2 power amplification tube are arranged on one side, and the Carrier 1 power amplification tube and the Carrier 2 power amplification tube are arranged on the other side. Specifically, a structure as shown in FIG. 17 specifically includes: a cover plate 1, a cavity 89 for enclosing the Carrier 1 power amplification tube and the Carrier 2 power amplification tube, a double-side PCB, a cavity 90 for enclosing the Peaking 1 power amplification tube and the Peaking 2 power amplification tube, and a cover plate 2. A power divider-end PCB connecting line 95 configured by the Peaking 1 power amplification tube and the Carrier 1 power amplification tube to connect to the power divider 81 and a combiner-end PCB connecting line 98 configured by the Peaking 2 power amplification tube and the Carrier 2 power amplification tube to connect to the combiner 82 pass through openings of the double-side PCB respectively to achieve connection between the corresponding power amplification tubes and the corresponding power dividers and combiners via a radio frequency cable or in a separate micro-strip manner, for instance.

As can be seen from the above, at least one power amplification tube may be located in a different plane from other power amplification tubes in the Doherty power amplifier according to the embodiments of the present disclosure. When two or more power amplification tubes are arranged on a layer of a double-side PCB, the at least one power amplification tube and the other power amplification tubes can be located on different sides of the PCB, namely both sides of the PCB can be provided with the power amplification tubes.

Obviously, compared with the traditional art, the embodiments of the present disclosure have the following remarkable advantages: (1) the area of the PCB plane of the Doherty power amplifier can be reduced by 50%; (2) the Carrier power amplification tubes and the Peaking power amplification tubes are cooled separately, thereby reducing heat influences on the Peaking power amplification tubes caused by the Carrier power amplification tubes, and more improving the performance of the Peaking power amplification tubes; (3) the Carrier power amplification tubes and the Peaking power amplification tubes are designed in different cavities respectively, thereby reducing mutual influences; and (4) cheaper materials can be adopted as cooling materials of the Peaking power amplification tubes, thereby reducing costs.

The above is only preferable embodiments of the present disclosure, and is not intended to limit the protection scope of the present disclosure.

What is claimed is:

1. A Doherty power amplifier, comprising at least one Carrier power amplification tube and at least one Peaking power amplification tube, wherein at least one Carrier power amplification tube is arranged in a different plane from at least one Peaking power amplification tube so as to overlap longitudinally.

2. The Doherty power amplifier according to claim 1, wherein the width of the Doherty power amplifier is smaller than a width formed by locating all the power amplification tubes in the same plane.

3. The Doherty power amplifier according to claim 1, wherein
when there are two or more Carrier power amplification tubes, all the Carrier power amplification tubes are located in different planes so as to overlap longitudinally; or, at least two Carrier power amplification tubes in all the Carrier power amplification tubes are located in the same plane.

4. The Doherty power amplifier according to claim 1, wherein the at least one Carrier power amplification tube and the at least one Peaking power amplification tube in the Doherty power amplifier are arranged on at least one Printed Circuit Board (PCB).

5. The Doherty power amplifier according to claim 4, wherein
the at least one PCB is a single-side PCB.

6. The Doherty power amplifier according to claim 4, wherein the at least one Carrier power amplification tubes and the at least one Peaking power amplification tube are connected via a combining or branching structure which comprises a radio frequency cable or a three-dimensional micro-strip line.

7. The Doherty power amplifier according to claim 4, further comprising a cover plate for the at least one Carrier power amplification tube or the at least one Peaking power amplification tubes in the same plane, wherein the cover plate and the PCB, where the at least one Carrier power amplification tube or the at least one Peaking power amplification tubes are located, form a shielding cavity for surrounding the at least one Carrier power amplification tube or the at least one Peaking power amplification tube.

8. The Doherty power amplifier according to claim 1, further comprising at least one power amplification tube path, wherein each power amplification tube path comprises at least one Carrier power amplification tube and at least one Peaking power amplification tube.

9. The Doherty power amplifier according to claim 1, wherein
when there are two or more Peaking power amplification tubes, all the Peaking power amplification tubes are located in different planes so as to overlap longitudinally; or, at least two Peaking power amplification tubes in all the Peaking power amplification tubes are located in the same plane.

10. The Doherty power amplifier according to claim 4, wherein
the at least one PCB is a double-side PCB.

11. The Doherty power amplifier according to claim 10, wherein
one of the at least one Carrier power amplification tube and one of the at least one Peaking power amplification tube are arranged respectively on two sides of the double-side PCB.

* * * * *